United States Patent
Lee et al.

(10) Patent No.: US 11,792,913 B2
(45) Date of Patent: Oct. 17, 2023

(54) MITIGATION OF PHYSICAL IMPACT-INDUCED MECHANICAL STRESS DAMAGE TO PRINTED CIRCUIT BOARDS

(71) Applicant: Google LLC, Mountain View, CA (US)

(72) Inventors: Eric Robert Lee, San Jose, CA (US); Hsinhsin Lee, San Jose, CA (US)

(73) Assignee: Google LLC, Mountain View, CA (US)

( * ) Notice: Subject to any disclaimer, the term of this patent is extended or adjusted under 35 U.S.C. 154(b) by 0 days.

(21) Appl. No.: 18/046,677

(22) Filed: Oct. 14, 2022

(65) Prior Publication Data

US 2023/0061712 A1 Mar. 2, 2023

Related U.S. Application Data

(60) Provisional application No. 63/379,420, filed on Oct. 13, 2022.

(51) Int. Cl.
  *H05K 9/00* (2006.01)
  *H05K 1/02* (2006.01)

(52) U.S. Cl.
  CPC ......... *H05K 1/0216* (2013.01); *H05K 1/0271* (2013.01); *H05K 9/0028* (2013.01)

(58) Field of Classification Search
  CPC .................................................. H05K 9/0028
  See application file for complete search history.

(56) References Cited

U.S. PATENT DOCUMENTS

| | | | |
|---|---|---|---|
| 6,263,564 B1* | 7/2001 | Holmberg | H05K 3/325 29/840 |
| 7,288,727 B1 | 10/2007 | Garcia | |
| 10,438,901 B1 | 10/2019 | Krefft et al. | |
| 2004/0240191 A1 | 12/2004 | Arnold et al. | |
| 2005/0212102 A1 | 9/2005 | Goudarzi | |
| 2007/0023203 A1 | 2/2007 | Leizerovich et al. | |
| 2009/0211789 A1* | 8/2009 | Yeates | H05K 3/361 29/830 |
| 2009/0231825 A1* | 9/2009 | Li | H05K 9/0028 361/818 |
| 2010/0089619 A1* | 4/2010 | Chen | H05K 1/0256 29/829 |
| 2011/0141714 A1* | 6/2011 | Hsieh | H05K 9/0028 361/818 |
| 2011/0255262 A1* | 10/2011 | Peng | H05K 9/0028 361/818 |
| 2017/0135200 A1* | 5/2017 | Chang | H05K 3/301 |
| 2017/0245404 A1* | 8/2017 | Koep | H05K 3/3494 |
| 2018/0116078 A1 | 4/2018 | Mun et al. | |
| 2018/0270997 A1* | 9/2018 | Lee | H05K 1/0216 |

(Continued)

*Primary Examiner* — Hung V Ngo
(74) *Attorney, Agent, or Firm* — Colby Nipper PLLC

(57) ABSTRACT

This document describes techniques and apparatuses directed to the mitigation of physical impact-induced mechanical stress damage to printed circuit boards through the utilization of a conductive shield track having a varied width (dynamic width). In an aspect, disclosed is a device that includes a printed circuit board, an electrical component on the printed circuit board in a shielded area, a conductive shield track on the printed circuit board, a component shield having a sidewall and a sidewall base, and solder disposed between the sidewall base and the conductive shield track to couple the component shield to the ground plane of the PCB to form a shielded compartment over the shielded area.

20 Claims, 4 Drawing Sheets

(56) References Cited

U.S. PATENT DOCUMENTS

| | | |
|---|---|---|
| 2018/0279516 A1* | 9/2018 | Lee .......................... C22C 9/06 |
| 2019/0045621 A1 | 2/2019 | Chuah et al. |
| 2019/0215993 A1* | 7/2019 | Yagi ....................... H01L 23/04 |
| 2021/0045226 A1* | 2/2021 | Sung .................... H05K 9/0052 |
| 2021/0176904 A1 | 6/2021 | Su |

* cited by examiner

US 11,792,913 B2

MITIGATION OF PHYSICAL IMPACT-INDUCED MECHANICAL STRESS DAMAGE TO PRINTED CIRCUIT BOARDS

INCORPORATION BY REFERENCE

This application claims priority under 35 U.S.C. § 119(e) to U.S. Provisional Patent Application 63/379,420, filed on Oct. 13, 2022 which is incorporated herein by reference in its entirety.

SUMMARY

This document describes techniques and apparatuses directed to the mitigation of physical impact-induced mechanical stress damage to printed circuit boards. In general, a first aspect of the present disclosure relates to a device that includes a printed circuit board, an electrical component disposed on the printed circuit board in a shielded area, a conductive shield track on the printed circuit board, a component shield for providing electromagnetic interference shielding for the electrical component, and solder disposed between the component shield and the conductive shield track. The printed circuit board includes a ground plane and a solder mask layer. The conductive shield track is defined in the solder mask layer and is coupled to the ground plane. The conductive shield track includes an elongated path around the shielded area and an apron extending laterally from a portion of the elongated path. The conductive shield track having a varied (dynamic) width along at least a portion of its length. The sidewall base of the component shield shaped to conform to the elongated path.

This Summary is provided to introduce simplified concepts of techniques and apparatuses directed to the mitigation of physical impact-induced mechanical stress damage to printed circuit boards, which are further described below in the Detailed Description and is illustrated in the Drawings. This Summary is not intended to identify essential features of the claimed subject matter, nor is it intended for use in determining the scope of the claimed subject matter.

BRIEF DESCRIPTION OF THE DRAWINGS

The details of one or more aspects of techniques and apparatuses directed to the mitigation of physical impact-induced mechanical stress damage to printed circuit boards are described in this document with reference to the following drawings, in which the use of same numbers in different instances may indicate similar features or components.

DETAILED DESCRIPTION

A computing device (e.g., a mobile communication device) may include a printed circuit board (PCB) and at least one electronic component on the PCB. A physical impact event (e.g., the dropping of the computing device onto a hard surface) may induce a mechanical stress that results in damage to the PCB. One type of PCB damage is PCB delamination—the physical separation of one or more base layers of a PCB. Another type of PCB damage is PCB trace cracking—the formation of a crack or fracture in a trace of a PCB. Regardless of the type, damage to a PCB may compromise the functionality of the circuit board.

With the continuous shrinking of electronics, component footprints are also shrinking, making available board layout space even more precious. In digital and radio frequency-based electronics, this may be exasperated by a need to utilize board space for electromagnetic interference (EMI) shielding to protect for radiated noise. EMI shielding can shield electronic components on the PCB that radiate signals (e.g., electromagnetic waves, radio frequency (RF) radiation) that may cause EMI and/or that may be sensitive to radiated signals. One example of EMI shielding is a component shield (e.g., component radiation shield) that forms an electromagnetic shield, which may be installed on the PCB over the electronic component to mitigate EMI. In an application, a shield track is defined on the PCB and a sidewall of the component shield is surface mounted to a shield track through a soldering process. As electronics shrink, the width of the shield track has gotten narrower and narrower, so as to optimize the usable board space. A potential location of impact-caused PCB damage is the soldered interface between the PCB and the component shield. As a result of narrow shield tracks, impact may cause PCB delamination due to the higher concentration of a pull force of the component shield during the impact (e.g., in the z-direction), because the forces applied to the board are concentrated in a smaller area (the narrow shield track). Additionally, such impacts may result in PCB trace cracking damage, again, as a result of the narrow shield tracks.

This document describes aspects of techniques and apparatuses for the mitigation of physical impact-induced mechanical stress damage to printed circuit boards. In aspects, the techniques and apparatuses implement a shield track of a dynamic width to increase the strength of solder bond between the component shield and the printed circuit board. By so doing, in some cases, the techniques and apparatuses may mitigate physical impact-induced mechanical stress damage to printed circuit boards.

Figure 1A:
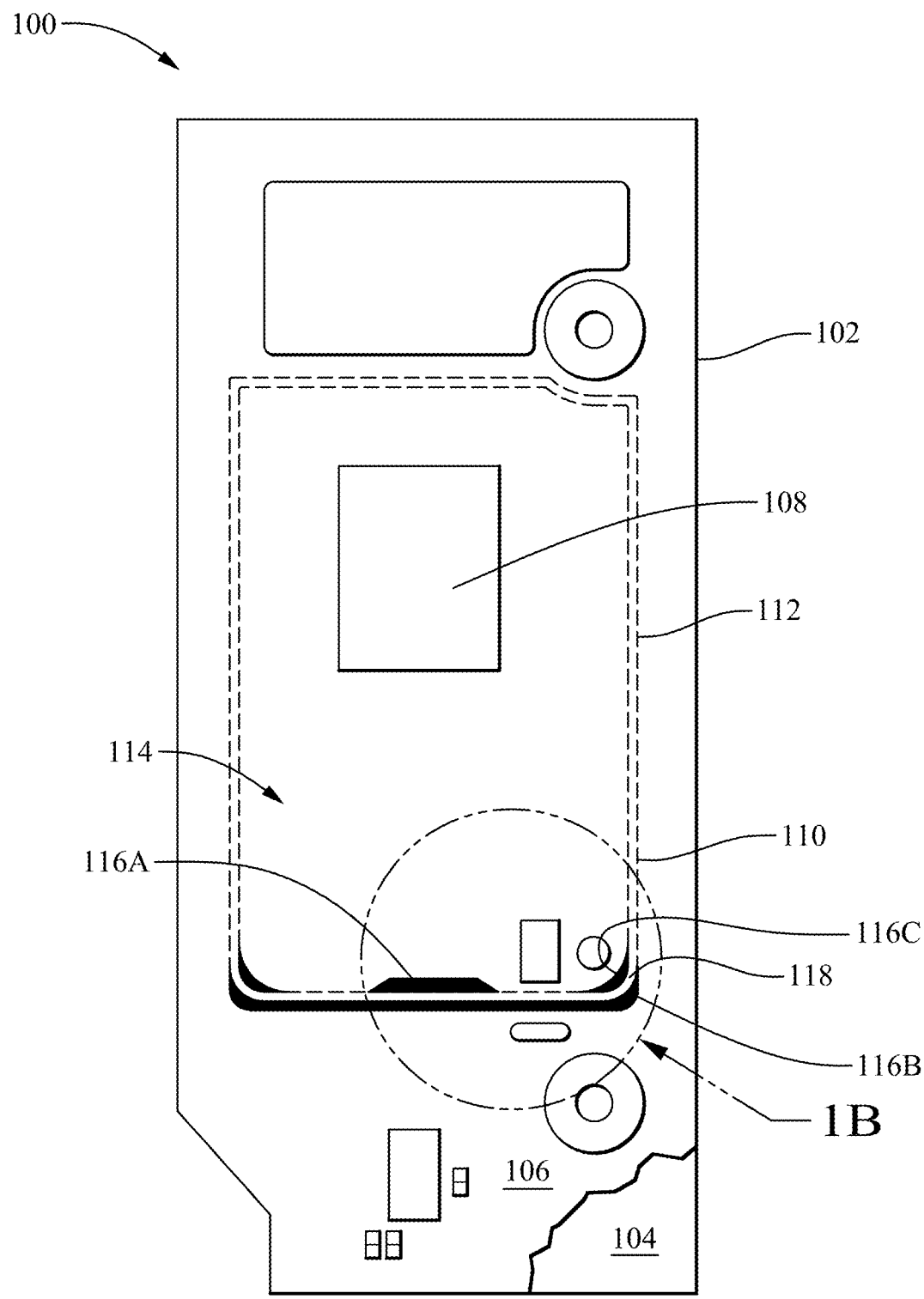
FIG. 1A is a plan view of a device in accordance with the techniques and apparatuses of this disclosure.
Figure 1B:
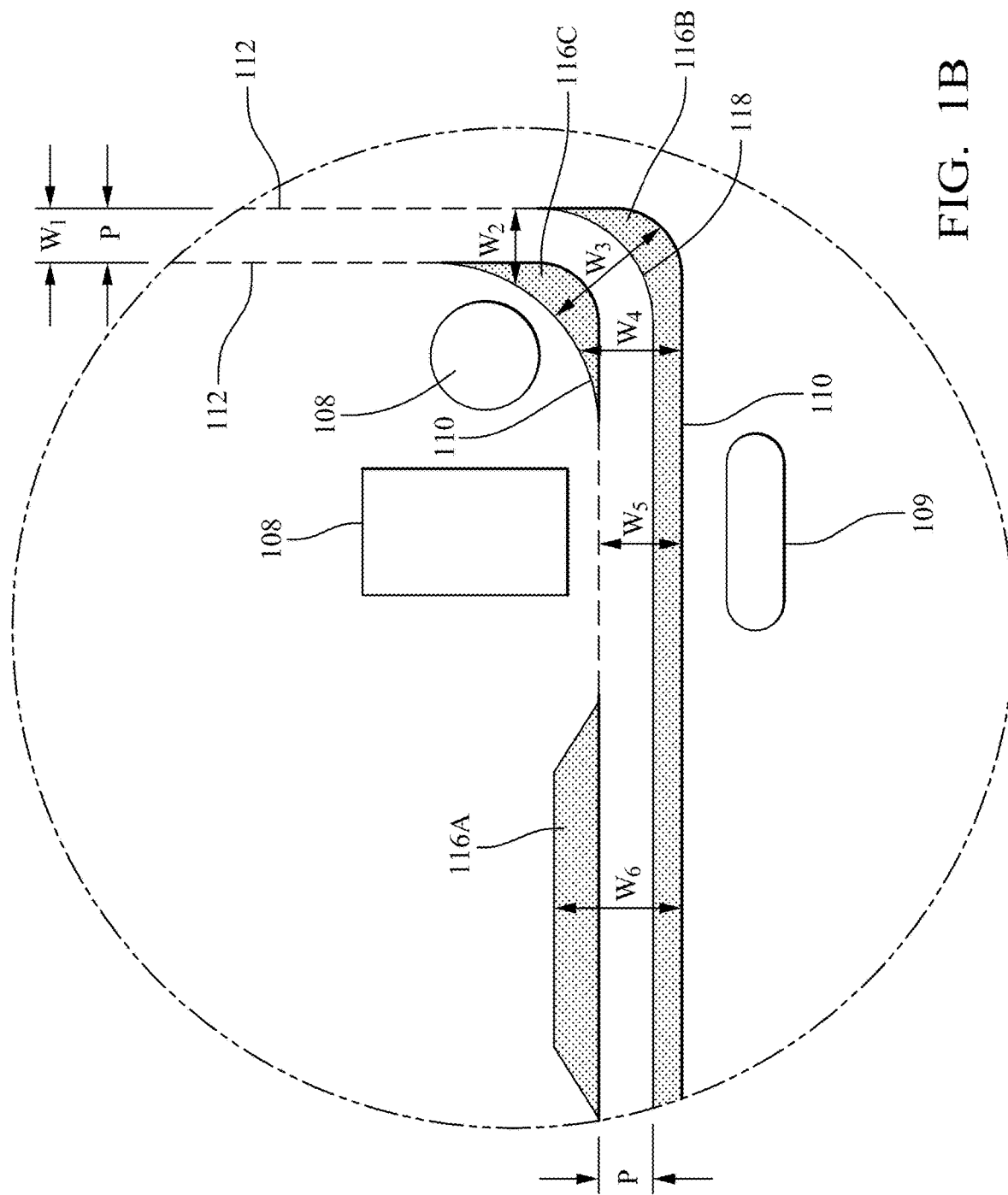
FIG. 1B is a detail view of the device of FIG. 1A.

FIGS. 1A and 1B illustrate, respectively, plan and detail views of an example device in accordance with the techniques and apparatuses of this disclosure. The device 100 includes a printed circuit board 102 (PCB 102), which includes an inner-layer ground plane 104 (ground plane 104) and a solder mask layer 106. The device 100 may further include an electrical component 108 and/or an electronic component 109 disposed on the PCB 102. The electrical component may include an active component (e.g., integrated circuit chip, transceiver chip, system-on-chip (SoC), central processing unit (CPU), antenna) that radiates signals (e.g., electromagnetic waves, radio frequency (RF) radiation) that may cause electromagnetic interference (EMI), an active component (e.g., an antenna) sensitive to radiated signals, and/or a passive component that is sensitive to radiated signals.

Figure 2:
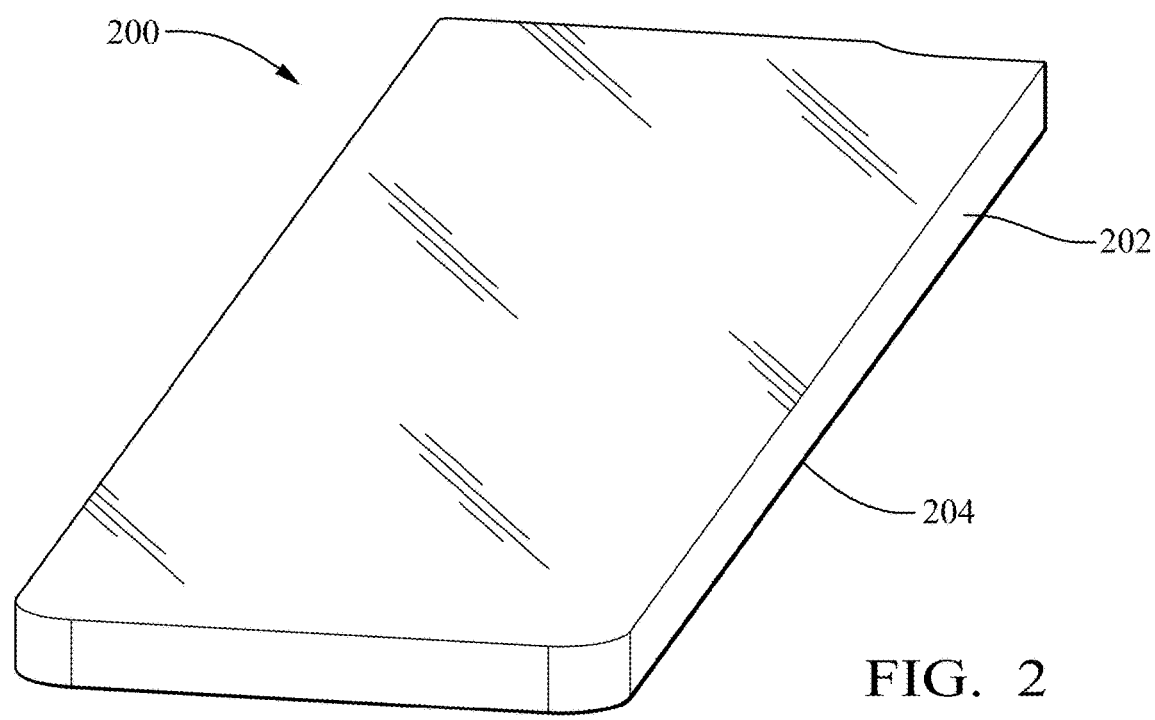
FIG. 2 is a top perspective view of a component shield in accordance with the techniques and apparatuses of this disclosure.
Figure 3:
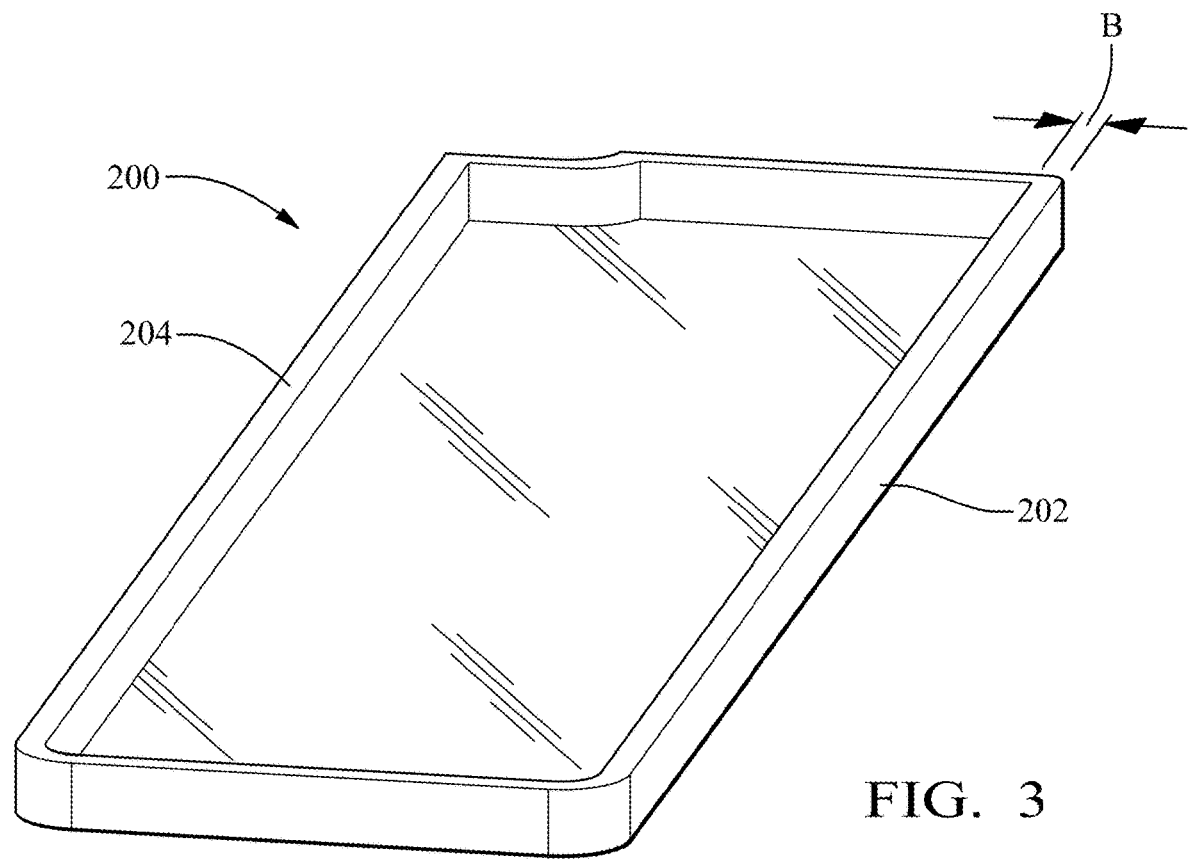
FIG. 3 is a bottom perspective view of the component shield of FIG. 2.
Figure 4A:
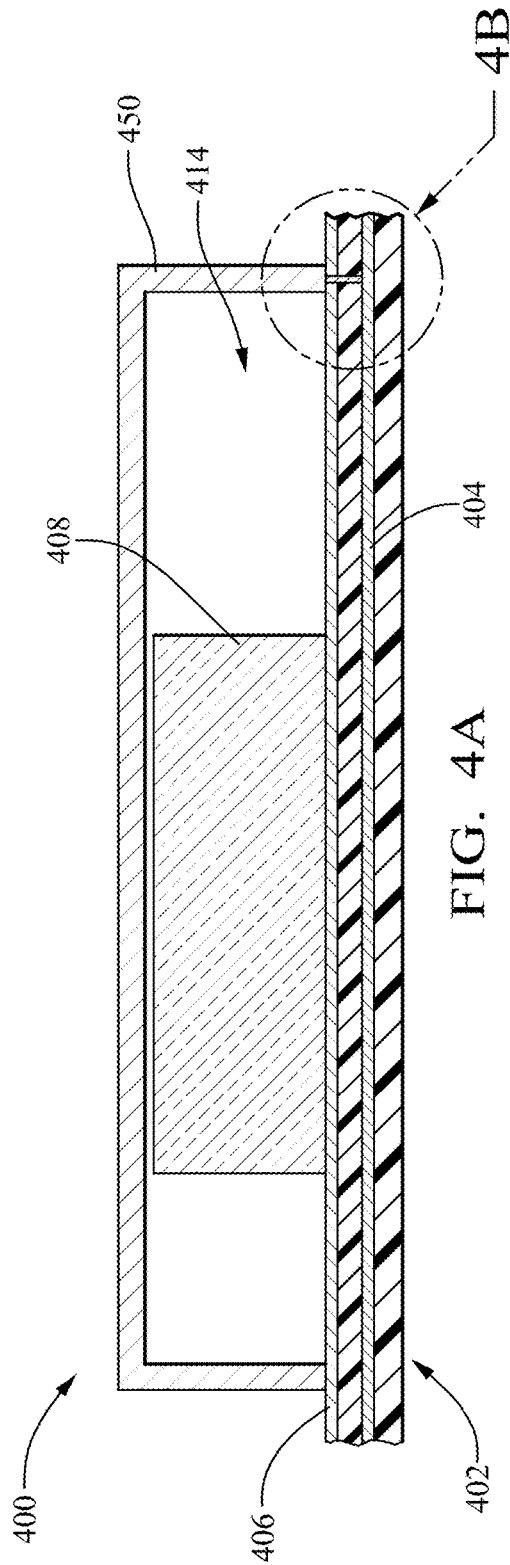
FIG. 4A is a cross-section of a device including a component shield installed on a printed circuit board in accordance with the techniques and apparatuses of this disclosure.
Figure 4B:
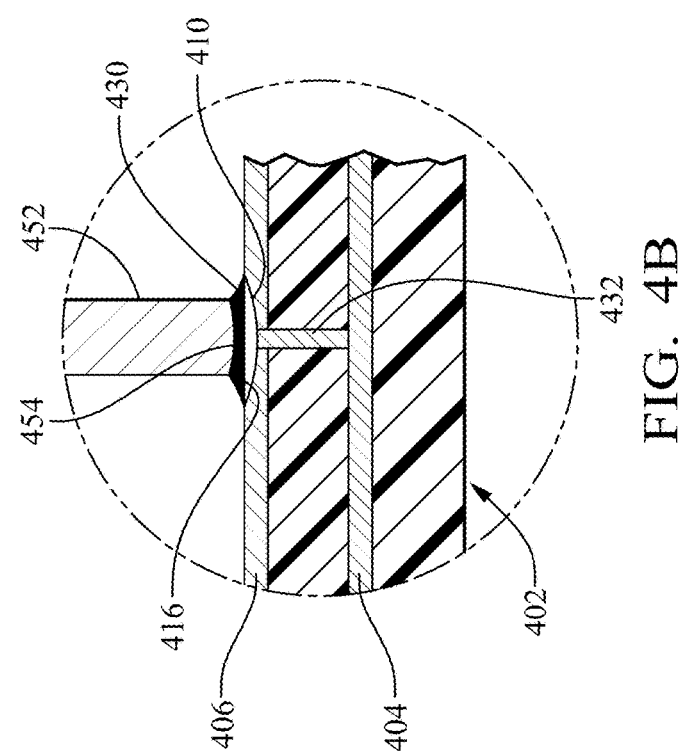
FIG. 4B is a detail view of the aspect of FIG. 4A.

The device 100 includes a conductive shield track 110 configured for receiving a component shield (e.g., component shield 200 in FIGS. 2 and 3, component shield 450 in FIGS. 4A and 4B). The conductive shield track 110 is a metalized trace pattern (e.g., trace, ground trace, solder pad) defined in the solder mask layer 106. The conductive shield track 110 connects to the ground plane 104 through one or more ground vias (illustrated as ground via 432 in FIG. 4B).

The metalized trace pattern of the conductive shield track 110 includes the elongated path 112 (e.g., path trace) and may include an apron trace (e.g., apron 116A, apron 116B, apron 116C). The elongated path 112 and the apron trace are electrically connected. The elongated path 112 extends around a shielded area 114 on the printed circuit board 102 that includes an electrical component 108. The elongated path 112 has a path width (P), illustrated in FIG. 1B. The apron trace (e.g., apron 116A, apron 116B, apron 116C) extends laterally from a portion of the elongated path 112. The apron trace may be elongated. An "inner" apron may extend laterally from an inner-facing portion of the elongated path 112 and an "outer" apron may extend laterally from an outer-facing portion of the elongated path 112. The apron has an apron width that may include at least one of a width of an inner apron or the width of an outer apron. In aspects, the apron width may be measured from the elongated path 112 to an inner and/or outer edge of the apron trace. The apron width may vary from a first position to a second position relative to the location of at least one electrical component on the printed circuit board that is adjacent to the first and second positions along a length of the conductive shield track. In aspects, the electrical component 108 is located within the shield area 114 and the component shield (e.g., component shield 200) provides electromagnetic interference shielding for the electrical component 108. In other aspects, an electrical component 109 (illustrated in FIG. 1B) is located outside of the shielded area 114.

An apron trace may be utilized in slack areas of the PCB (e.g., areas of the board that have unused space, areas spaced apart from other components and/or traces on the board) that are assessed to have a potential for physical impact-induced mechanical stress. For example, in FIG. 1B, the apron traces (e.g., apron 116A, apron 116B, apron 116C) are spaced apart from an electrical component 108 and/or an electrical component 109. The apron trace may distribute the pull forces resulting from physical impact and mitigate mechanical stresses that can result in damage to the PCB (e.g., delamination). In aspects, the inclusion of an apron trace provides a wider solder connection to the PCB.

The elongated path 112 may include at least one path corner 118. The apron trace extends laterally from the elongated path 112 at the path corner 118. For example, as apron 116C from the inner-facing portion of the elongated path 112 and as apron 116B from the outer-facing portion of elongated path 112.

At a given location along the length of the conductive shield track 110, the conductive shield track 110 has a width equal to the width of the path plus the width of an inner apron (if any) plus the width of an outer apron (if any). As a result, the conductive shield track 110 may have a varied (dynamic) conductive shield track width along at least a portion of its length (e.g., from a first location along the conductive shield track to a second location along the conductive shield track).

A first example of a dynamic shield track width is illustrated in FIG. 1B. At a first location along the length of the conductive shield track 110, the conductive shield track 110 has a width $W_1$ equal to the width of the path (width P). At a second location along the length of the conductive shield track 110, the conductive shield track 110 has a width $W_2$ equal to the width of the path (width P) plus the width of the apron 116C at the second location. At a third location along the length of the conductive shield track 110, the conductive shield track 110 has a width $W_3$ equal to the width of the path (width P) plus the width of the apron 116C and the width of apron 116B at the third location. At a fourth location along the length of the conductive shield track 110, the conductive shield track 110 has a width $W_4$ equal to the width of the path (width P) plus the width of the apron 116C and the width of apron 116B at the fourth location. At a fifth location along the length of the conductive shield track 110, the conductive shield track 110 has a width $W_5$ equal to the width of the path (width P) plus the width of the apron 116B at the fifth location. At a sixth location along the length of the conductive shield track 110, the conductive shield track 110 has a width $W_6$ equal to the width of the path (width P) plus the width of the apron 116B plus the width of the apron 116A at the sixth location. A location may be perpendicular to the path.

In another aspect, the elongated path has a path width and the apron has an apron width. The width of the conductive shield track at the first location is at least one of the path width at the first location or the sum of the path width and the apron width at the first location. The width of the conductive shield track at the second location is at least one of the path width at the second location or the sum of the path width and the apron width at the second location. The width of the conductive shield track at the first location may be different than the width of the conductive shield track at the second location.

FIG. 2 is a top perspective view of a component shield 200 in accordance with the techniques and apparatuses of this disclosure and FIG. 3 is a bottom perspective view of the component shield 200 of FIG. 2. The component shield 200 provides electromagnetic interference shielding for the electrical component (e.g., electrical component 108) and thereby provides RF isolation between circuits, prevents external interference, and/or prevents the leakage of RF signals. Examples of component shields include radio frequency (RF) shields, RF shield cans, RF shield covers, EMI shields.

The component shield 200 includes a sidewall 202 that is configured to extend around the shielded area (e.g., shielded area 114 of FIG. 1). The sidewall 202 includes a sidewall base 204 (base 204) is configured to couple with the conductive shield track. The base 204 is shaped to conform to the elongated path (e.g., elongated path 112 of FIGS. 1A and 1B). The base 204 has a base width (B), illustrated in FIG. 3. In aspects, the base width (B) is consistent around a periphery of the sidewall 202. The path width (P), illustrated in FIG. 1B, may be equal to the base width (B). In aspects, the sidewall base 204 is shaped to conform to the elongated path 112 at the path corner 118, and the apron extends laterally from the elongated path 112 at the path corner 118.

FIG. 4A is a cross-section of a device 400 including a component shield 450 in accordance with the techniques and apparatuses of this disclosure. FIG. 4B is a detail view of the device 400 illustrated in FIG. 4A. The device 400 may be similar to the device 100 illustrated in FIGS. 1A and 1B and described above. The component shield 450 may be similar to the component shield 200 illustrated in FIGS. 2 and 3 and described above. Thus, device 400 includes a printed circuit board 402, inner-layer ground plane 404, a solder mask layer 406, electrical component 408, conductive shield track 410, an elongated path (not illustrated), a shielded area 414, at least one apron 416, a component shield 450 installed on the printed circuit board 402, a component shield sidewall 452, and a component shield sidewall base 454.

The conductive shield track 110 connects to the ground plane 104 through at least one ground via 432. The device

400 further includes solder 430 disposed between the sidewall base 454 of the component shield 450 and the conductive shield track 410 to couple the component shield 450 to the ground plane 404 to form a shielded compartment over the shielded area 414.

CONCLUSION

As used herein, a phrase referring to "at least one of" a list of items refers to any combination of those items, including single members. As an example, "at least one of: a, b, or c" is intended to cover a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, c-c-c, or any other ordering of a, b, and c).

Although concepts of techniques and apparatuses directed to mitigating physical impact-induced mechanical stress damage to printed circuit boards, have been described in language specific to techniques and/or apparatuses, it is to be understood that the subject of the appended claims is not necessarily limited to the specific techniques or apparatuses described. Rather, the specific techniques and apparatuses are disclosed as example implementations of ways in which the prevention of physical impact-induced mechanical stress damage to printed circuit boards may be implemented.

What is claimed is:

1. A device comprising:
   a printed circuit board, the printed circuit board comprising a ground plane and a solder mask layer;
   a conductive shield track, the conductive shield track defined in the solder mask layer and coupled to the ground plane of the printed circuit board, the conductive shield track comprising an elongated path around a shielded area on the printed circuit board and an apron extending laterally from a portion of the elongated path, the conductive shield track having a varied width;
   a component shield for providing electromagnetic interference shielding, the component shield comprising:
      a sidewall configured to extend around the shielded area, the sidewall including a sidewall base configured to couple with the conductive shield track, the sidewall base shaped to conform to the elongated path; and
   solder disposed between the sidewall base of the component shield and the conductive shield track to couple the component shield to the ground plane to form a shielded compartment over the shielded area.

2. The device of claim 1, wherein the varied width of the conductive shield track varies from a first location along the conductive shield track to a second location along the conductive shield track.

3. The device of claim 2, wherein:
   the elongated path has a path width and the apron has an apron width;
   the varied width of the conductive shield track at the first location is at least one of:
      the path width at the first location, or
      a sum of the path width and the apron width at the first location;
   the width of the conductive shield track at the second location is at least one of:
      the path width at the second location, or
      a sum of the path width and the apron width at the second location; and
   the width of the conductive shield track at the first location is different than the width of the conductive shield track at the second location.

4. The device of claim 3, wherein the apron width includes at least one of a width of an inner apron or the width of an outer apron.

5. The device of claim 1, wherein:
   the elongated path has a path width and the apron has an apron width, and
   the apron width varies from a first position to a second position relative to a location of at least one electrical component on the printed circuit board adjacent the first and second positions along a length of the conductive shield track.

6. The device of claim 5, wherein the electrical component is located within the shield area and the component shield provides electromagnetic interference shielding for the electrical component.

7. The device of claim 1, wherein the elongated path includes at least one path corner, the sidewall base is shaped to conform to the elongated path at the path corner, and the apron extends laterally from the elongated path at the path corner.

8. The device of claim 1, wherein the elongated path has a path width and the sidewall base includes a base width equal to the path width.

9. The device of claim 8, wherein the base width is consistent around a periphery of the sidewall.

10. The device of claim 1, wherein the apron is located on at least one of an inner-facing portion of the elongated path or an outer-facing portion of the elongated path.

11. The device of claim 1, wherein:
    the varied width of the conductive shield track varies from a first location along the conductive shield track to a second location along the conductive shield track,
    the elongated path includes at least one path corner,
    the sidewall base is shaped to conform to the elongated path at the path corner, and
    the apron extends laterally from the elongated path at the path corner.

12. The device of claim 1, wherein:
    the varied width of the conductive shield track varies from a first location along the conductive shield track to a second location along the conductive shield track,
    the elongated path has a path width, and
    the sidewall base includes a base width equal to the path width.

13. The device of claim 1, wherein:
    the varied width of the conductive shield track varies from a first location along the conductive shield track to a second location along the conductive shield track, and
    the apron is located on at least one of an inner-facing portion of the elongated path or an outer-facing portion of the elongated path.

14. The device of claim 1, wherein:
    the varied width of the conductive shield track varies from a first location along the conductive shield track to a second location along the conductive shield track,
    the elongated path includes at least one path corner,
    the sidewall base is shaped to conform to the elongated path at the path corner,
    the apron extends laterally from the elongated path at the path corner,
    the elongated path has a path width, and
    the sidewall base includes a base width equal to the path width.

15. The device of claim 1, wherein:
    the varied width of the conductive shield track varies from a first location along the conductive shield track to a second location along the conductive shield track, the elongated path has a path width, the sidewall base includes a base width equal to the path width, and the apron is located on at least one of an inner-facing portion of the elongated path or an outer-facing portion of the elongated path.

16. The device of claim 1, wherein:

the elongated path has a path width, the apron has an apron width, the apron width varies from a first position to a second position relative to a location of at least one electrical component on the printed circuit board adjacent the first and second positions along a length of the conductive shield track, the elongated path includes at least one path corner, the sidewall base is shaped to conform to the elongated path at the path corner, and the apron extends laterally from the elongated path at the path corner.

17. The device of claim 1, wherein:

the elongated path has a path width, the apron has an apron width, the apron width varies from a first position to a second position relative to a location of at least one electrical component on the printed circuit board adjacent the first and second positions along a length of the conductive shield track, and the sidewall base includes a base width equal to the path width.

18. The device of claim 1, wherein:

the elongated path has a path width, the apron has an apron width, the apron width varies from a first position to a second position relative to a location of at least one electrical component on the printed circuit board adjacent the first and second positions along a length of the conductive shield track, and the apron is located on at least one of an inner-facing portion of the elongated path or an outer-facing portion of the elongated path.

19. The device of claim 1, wherein:

the elongated path includes at least one path corner, the sidewall base is shaped to conform to the elongated path at the path corner, the apron extends laterally from the elongated path at the path corner, the elongated path has a path width, and the sidewall base includes a base width equal to the path width.

20. The device of claim 1, wherein:

the elongated path has a path width, the sidewall base includes a base width equal to the path width, and the apron is located on at least one of an inner-facing portion of the elongated path or an outer-facing portion of the elongated path.

\* \* \* \* \*